US008717775B1

(12) United States Patent
Bolognia et al.

(10) Patent No.: US 8,717,775 B1
(45) Date of Patent: May 6, 2014

(54) FINGERPRINT SENSOR PACKAGE AND METHOD

(75) Inventors: David Bolognia, Scottsdale, AZ (US); Ted Adlam, Phoenix, AZ (US); Mike Kelly, Queen Creek, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 304 days.

(21) Appl. No.: 12/848,833

(22) Filed: Aug. 2, 2010

(51) Int. Cl.
*H05K 1/11* (2006.01)

(52) U.S. Cl.
USPC ................................. 361/803; 361/761

(58) Field of Classification Search
USPC ........... 361/803, 56, 112, 220, 230, 719, 720, 361/761, 764, 767, 768, 780; 174/255
See application file for complete search history.

(56) References Cited

U.S. PATENT DOCUMENTS

| 3,868,724 A | 2/1975 | Perrino |
| 1,916,434 A | 10/1975 | Garboushian |
| 4,322,778 A | 3/1982 | Barbour et al. |
| 4,532,419 A | 7/1985 | Takeda |
| 4,642,160 A | 2/1987 | Burgess |
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | MacIver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Movern |
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |

(Continued)

FOREIGN PATENT DOCUMENTS

| JP | 05-109975 | 4/1993 |
| JP | 05-136323 | 6/1993 |
| JP | 07-017175 | 1/1995 |
| JP | 08-190615 | 7/1996 |
| JP | 10-334205 | 12/1998 |

OTHER PUBLICATIONS

IBM Technical Disclosure Bulletin, "Microstructure Solder Mask by Means of a Laser", vol. 36, Issue 11, p. 589, Nov. 1, 1993. (NN9311589).

(Continued)

*Primary Examiner* — Jeremy C Norris
*Assistant Examiner* — Tremesha S Willis
(74) *Attorney, Agent, or Firm* — McAndrews, Held & Malloy

(57) ABSTRACT

A fingerprint sensor package includes a flat surface having a dielectric protective coating protecting a sensing element of a fingerprint sensor and an electrically conductive bezel that discharges electrostatic discharge (ESD). Both the protective coating and the bezel can be colored to have desired colors. Accordingly, the flat surface can be colored as desired enhancing the attractiveness for consumer applications. Further, light emitting diodes are integrated into the fingerprint sensor package providing a visual feedback to the user that the user's fingerprint has been successfully sensed. Further, the fingerprint sensor package is formed using a high volume low cost assembly technique.

18 Claims, 7 Drawing Sheets

(56) References Cited

U.S. PATENT DOCUMENTS

| | | |
|---|---|---|
| 5,110,664 A | 5/1992 | Nakanishi et al. |
| 5,191,174 A | 3/1993 | Chang et al. |
| 5,229,550 A | 7/1993 | Bindra et al. |
| 5,239,448 A | 8/1993 | Perkins et al. |
| 5,247,429 A | 9/1993 | Iwase et al. |
| 5,250,843 A | 10/1993 | Eichelberger |
| 5,278,726 A | 1/1994 | Bernardoni et al. |
| 5,283,459 A | 2/1994 | Hirano et al. |
| 5,353,498 A | 10/1994 | Fillion et al. |
| 5,371,654 A | 12/1994 | Beaman et al. |
| 5,379,191 A | 1/1995 | Carey et al. |
| 5,404,044 A | 4/1995 | Booth et al. |
| 5,463,253 A | 10/1995 | Waki et al. |
| 5,474,957 A | 12/1995 | Urushima |
| 5,474,958 A | 12/1995 | Djennas et al. |
| 5,497,033 A | 3/1996 | Fillion et al. |
| 5,508,938 A | 4/1996 | Wheeler |
| 5,530,288 A | 6/1996 | Stone |
| 5,531,020 A | 7/1996 | Durand et al. |
| 5,546,654 A | 8/1996 | Wojnarowski et al. |
| 5,574,309 A | 11/1996 | Papapietro et al. |
| 5,581,498 A | 12/1996 | Ludwig et al. |
| 5,582,858 A | 12/1996 | Adamopoulos et al. |
| 5,616,422 A | 4/1997 | Ballard et al. |
| 5,637,832 A | 6/1997 | Danner |
| 5,674,785 A | 10/1997 | Akram et al. |
| 5,719,749 A | 2/1998 | Stopperan |
| 5,726,493 A | 3/1998 | Yamashita et al. |
| 5,739,581 A | 4/1998 | Chillara et al. |
| 5,739,585 A | 4/1998 | Akram et al. |
| 5,739,588 A | 4/1998 | Ishida et al. |
| 5,742,479 A | 4/1998 | Asakura |
| 5,774,340 A | 6/1998 | Chang et al. |
| 5,784,259 A | 7/1998 | Asakura |
| 5,798,014 A | 8/1998 | Weber |
| 5,822,190 A | 10/1998 | Iwasaki |
| 5,826,330 A | 10/1998 | Isoda et al. |
| 5,835,355 A | 11/1998 | Dordi |
| 5,847,453 A | 12/1998 | Uematsu et al. |
| 5,883,425 A | 3/1999 | Kobayashi |
| 5,894,108 A | 4/1999 | Mostafazadeh et al. |
| 5,903,052 A | 5/1999 | Chen et al. |
| 5,907,477 A | 5/1999 | Tuttle et al. |
| 5,936,843 A | 8/1999 | Ohshima et al. |
| 5,952,611 A | 9/1999 | Eng et al. |
| 6,004,619 A | 12/1999 | Dippon et al. |
| 6,013,948 A | 1/2000 | Akram et al. |
| 6,021,564 A | 2/2000 | Hanson |
| 6,028,364 A | 2/2000 | Ogino et al. |
| 6,034,427 A | 3/2000 | Lan et al. |
| 6,035,527 A | 3/2000 | Tamm |
| 6,040,622 A | 3/2000 | Wallace |
| 6,060,778 A | 5/2000 | Jeong et al. |
| 6,069,407 A | 5/2000 | Hamzehdoost |
| 6,072,243 A | 6/2000 | Nakanishi |
| 6,081,036 A | 6/2000 | Hirano et al. |
| 6,119,338 A | 9/2000 | Wang et al. |
| 6,122,171 A | 9/2000 | Akram et al. |
| 6,127,833 A | 10/2000 | Wu et al. |
| 6,160,705 A | 12/2000 | Stearns et al. |
| 6,172,419 B1 | 1/2001 | Kinsman |
| 6,175,087 B1 | 1/2001 | Keesler et al. |
| 6,184,463 B1 | 2/2001 | Panchou et al. |
| 6,194,250 B1 | 2/2001 | Melton et al. |
| 6,204,453 B1 | 3/2001 | Fallon et al. |
| 6,214,641 B1 | 4/2001 | Akram |
| 6,235,554 B1 | 5/2001 | Akram et al. |
| 6,239,485 B1 | 5/2001 | Peters et al. |
| D445,096 S | 7/2001 | Wallace |
| D446,525 S | 8/2001 | Okamoto et al. |
| 6,274,821 B1 | 8/2001 | Echigo et al. |
| 6,280,641 B1 | 8/2001 | Gaku et al. |
| 6,316,285 B1 | 11/2001 | Jiang et al. |
| 6,351,031 B1 | 2/2002 | Iijima et al. |
| 6,353,999 B1 | 3/2002 | Cheng |
| 6,365,975 B1 | 4/2002 | DiStefano et al. |
| 6,376,906 B1 | 4/2002 | Asai et al. |
| 6,392,160 B1 | 5/2002 | Andry et al. |
| 6,395,578 B1 | 5/2002 | Shin et al. |
| 6,405,431 B1 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,448,510 B1 | 9/2002 | Neftin et al. |
| 6,451,509 B2 | 9/2002 | Keesler et al. |
| 6,479,762 B2 | 11/2002 | Kusaka |
| 6,497,943 B1 | 12/2002 | Jimarez et al. |
| 6,517,995 B1 | 2/2003 | Jacobson et al. |
| 6,534,391 B1 | 3/2003 | Huemoeller et al. |
| 6,544,638 B2 | 4/2003 | Fischer et al. |
| 6,586,682 B2 | 7/2003 | Strandberg |
| 6,608,757 B1 | 8/2003 | Bhatt et al. |
| 6,628,812 B1 * | 9/2003 | Setlak et al. .................. 382/124 |
| 6,660,559 B1 | 12/2003 | Huemoeller et al. |
| 6,715,204 B1 | 4/2004 | Tsukada et al. |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,774,748 B1 | 8/2004 | Ito et al. |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,838,776 B2 | 1/2005 | Leal et al. |
| 6,888,240 B2 | 5/2005 | Towle et al. |
| 6,919,514 B2 | 7/2005 | Konrad et al. |
| 6,921,968 B2 | 7/2005 | Chung |
| 6,921,975 B2 | 7/2005 | Leal et al. |
| 6,931,726 B2 | 8/2005 | Boyko et al. |
| 6,953,995 B2 | 10/2005 | Farnworth et al. |
| 7,015,075 B2 | 3/2006 | Fay et al. |
| 7,030,469 B2 | 4/2006 | Mahadevan et al. |
| 7,081,661 B2 | 7/2006 | Takehara et al. |
| 7,125,744 B2 | 10/2006 | Takehara et al. |
| 7,185,426 B1 | 3/2007 | Hiner et al. |
| 7,198,980 B2 | 4/2007 | Jiang et al. |
| 7,242,081 B1 | 7/2007 | Lee |
| 7,282,394 B2 | 10/2007 | Cho et al. |
| 7,285,855 B2 | 10/2007 | Foong |
| 7,345,361 B2 | 3/2008 | Mallik et al. |
| 7,372,151 B1 | 5/2008 | Fan et al. |
| 7,429,786 B2 | 9/2008 | Karnezos et al. |
| 7,459,202 B2 | 12/2008 | Magera et al. |
| 7,510,108 B2 * | 3/2009 | Lawlyes et al. ............ 228/179.1 |
| 7,548,430 B1 | 6/2009 | Huemoeller et al. |
| 7,550,857 B1 | 6/2009 | Longo et al. |
| 7,633,765 B1 | 12/2009 | Scanlan et al. |
| 7,671,457 B1 | 3/2010 | Hiner et al. |
| 7,777,351 B1 | 8/2010 | Berry et al. |
| 7,953,257 B2 * | 5/2011 | Chen et al. .................... 382/124 |
| 8,139,373 B2 * | 3/2012 | Suzuki et al. ................. 361/800 |
| 2002/0017712 A1 | 2/2002 | Bessho et al. |
| 2002/0061642 A1 | 5/2002 | Haji et al. |
| 2002/0066952 A1 | 6/2002 | Taniguchi et al. |
| 2002/0195697 A1 | 12/2002 | Mess et al. |
| 2003/0025199 A1 | 2/2003 | Wu et al. |
| 2003/0128096 A1 | 7/2003 | Mazzochette |
| 2003/0141582 A1 | 7/2003 | Yang et al. |
| 2003/0197284 A1 | 10/2003 | Khiang et al. |
| 2003/0215116 A1 | 11/2003 | Brandt et al. |
| 2004/0063246 A1 | 4/2004 | Karnezos |
| 2004/0145044 A1 | 7/2004 | Sugaya et al. |
| 2004/0154405 A1 | 8/2004 | Ganapathi et al. |
| 2004/0159462 A1 | 8/2004 | Chung |
| 2005/0030724 A1 | 2/2005 | Ryhanen et al. |
| 2005/0031174 A1 | 2/2005 | Ryhanen et al. |
| 2005/0069178 A1 | 3/2005 | Nysaether et al. |
| 2005/0139985 A1 | 6/2005 | Takahashi |
| 2005/0231215 A1 | 10/2005 | Gozzini |
| 2005/0231216 A1 | 10/2005 | Gozzini |
| 2005/0242425 A1 | 11/2005 | Leal et al. |
| 2005/0281441 A1 | 12/2005 | Martinsen et al. |

(56) References Cited

U.S. PATENT DOCUMENTS

| | | | |
|---|---|---|---|
| 2006/0050935 A1 | 3/2006 | Bustgens et al. | |
| 2006/0083411 A1* | 4/2006 | Benkley | 382/124 |
| 2006/0267169 A1* | 11/2006 | Bolken et al. | 257/678 |
| 2007/0273049 A1 | 11/2007 | Khan et al. | |
| 2007/0281471 A1 | 12/2007 | Hurwitz et al. | |
| 2007/0290376 A1 | 12/2007 | Zhao et al. | |
| 2008/0079100 A1* | 4/2008 | Manansala | 257/415 |
| 2008/0230887 A1 | 9/2008 | Sun et al. | |
| 2009/0073632 A1* | 3/2009 | Yang et al. | 361/220 |
| 2009/0141464 A1* | 6/2009 | Taguchi et al. | 361/760 |
| 2009/0169071 A1 | 7/2009 | Bond et al. | |
| 2010/0097080 A1* | 4/2010 | Kobayashi et al. | 324/692 |

OTHER PUBLICATIONS

Kim et al., "Application of Through Mold Via (TMV) as PoP base package", *58th ECTC Proceedings*, May 2008, Lake Buena Vista, FL, 6 pages, IEEE.

Scanlan, "Package-on-package (PoP) with Through-mold Vias", *Advanced Packaging*, Jan. 2008, 3 pages, vol. 17, Issue 1, PennWell Corporation.

Hiner et al., "Printed Wiring Motherboard Having Bonded Interconnect Redistribution Mesa", U.S. Appl. No. 10/992,371, filed Nov. 18, 2004.

Kelly et al., "Exposed Metal Bezel for Use in Sensor Devices and Method Therefor", U.S. Appl. No. 11/616,069, filed Dec. 26, 2006.

Huemoeller et al., "Build Up Motherboard Fabrication Method and Structure", U.S. Appl. No. 11/824,395, filed Jun. 29, 2007.

Longo et al., "Stacked Redistribution Layer (RDL) Die Assembly Package", U.S. Appl. No. 12/387,672, filed May 5, 2009.

Huemoeller et al., "Buildup Dielectric Layer Having Metallization Pattern Semiconductor Package Fabrication Method", U.S. Appl. No. 12/387,691, filed May 5, 2009.

Miller, Jr. et al., "Thermal Via Heat Spreader Package and Method", U.S. Appl. No. 12/421,118, filed Apr. 9, 2009.

\* cited by examiner

FINGERPRINT SENSOR PACKAGE AND METHOD

TECHNICAL FIELD

The present application relates to the field of electronics, and more particularly, to methods of forming electronic component packages and related structures.

BACKGROUND

For user verification and other purposes, many devices such as portable computers and cellular telephone include a fingerprint sensor. A fingerprint sensor, sometimes called a biometric sensor, senses a fingerprint of a finger place on the fingerprint sensor. The obtained fingerprint is compared to an authorized user's stored fingerprint. If there is a match, the user is verified.

There are two commonly used fingerprint sensors in consumer applications. The first type of fingerprint sensor is a silicon die fingerprint sensor. The sensing element that senses the fingerprint is located on an active surface of the silicon die fingerprint sensor.

The second type of fingerprint sensor is a sensing element on flex fingerprint sensor. The sensing element that senses the fingerprint is located on a flexible dielectric substrate.

To reduce the cost of the devices in which the fingerprint sensors are used, it is desirable to package the fingerprint sensors at low cost.

BRIEF DESCRIPTION OF THE DRAWINGS

In the following description, the same or similar elements are labeled with the same or similar reference numbers.

DETAILED DESCRIPTION

Figure 1:
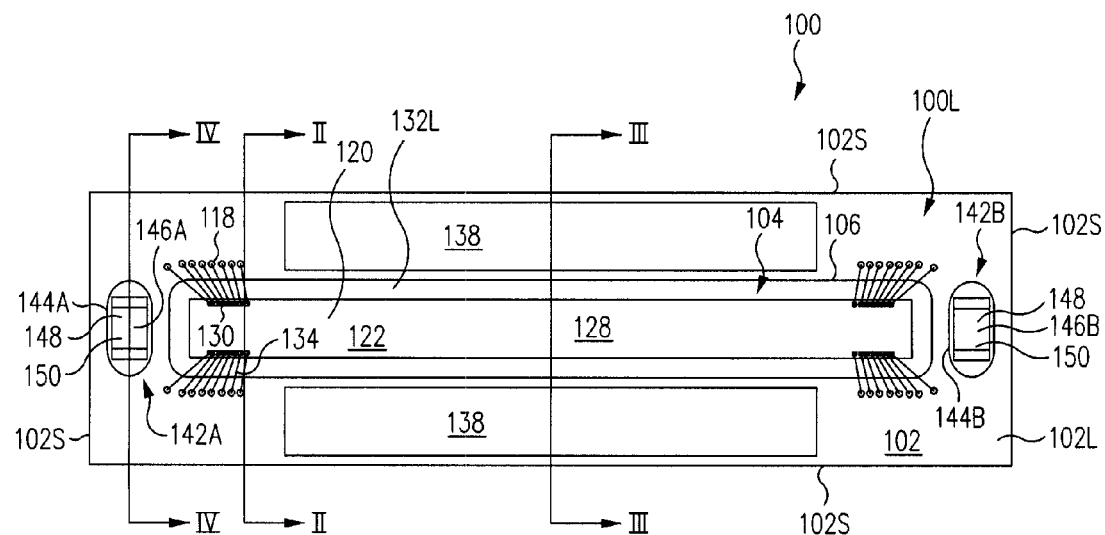
FIG. 1 is a bottom plan view of a full cavity fingerprint sensor package in accordance with one embodiment.

As an overview and in accordance with one embodiment, referring to FIGS. 1-5, a fingerprint sensor package 100 includes a flat surface 100L having a dielectric protective coating 136 protecting a sensing element 128 of a fingerprint sensor 120 and an electrically conductive bezel 138 that discharges electrostatic discharge (ESD). Both protective coating 136 and bezel 138 can be colored to have desired colors. Accordingly, flat surface 100L can be colored as desired enhancing the attractiveness for consumer applications. Further, light emitting diodes 146A, 146B are integrated into fingerprint sensor package 100 providing a visual feedback to the user that the user's fingerprint has been successfully sensed. Further, fingerprint sensor package 100 is formed using a high volume low cost assembly technique.

Figure 5:
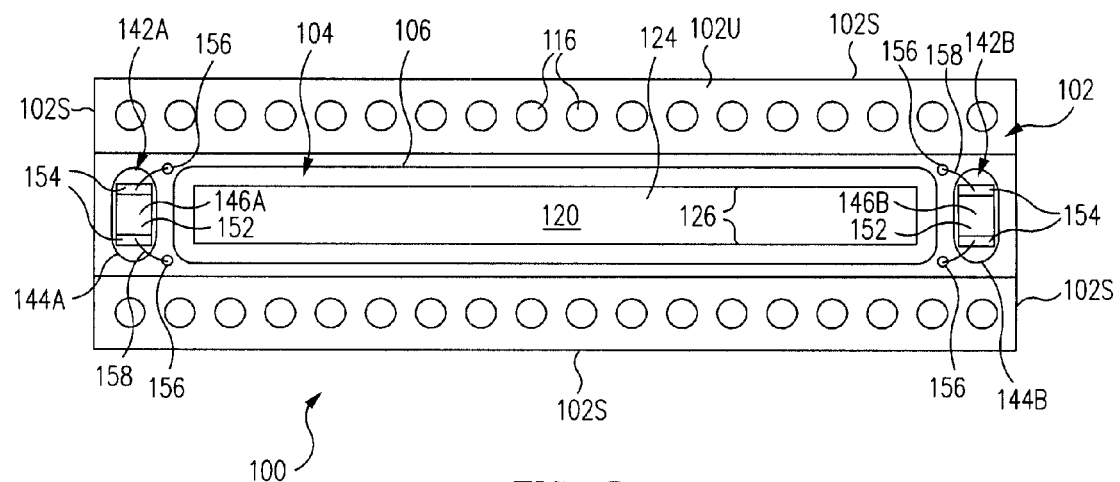
FIG. 5 is a top plan view of the full cavity fingerprint sensor package of FIG. 1 in accordance with one embodiment.
Figure 2:
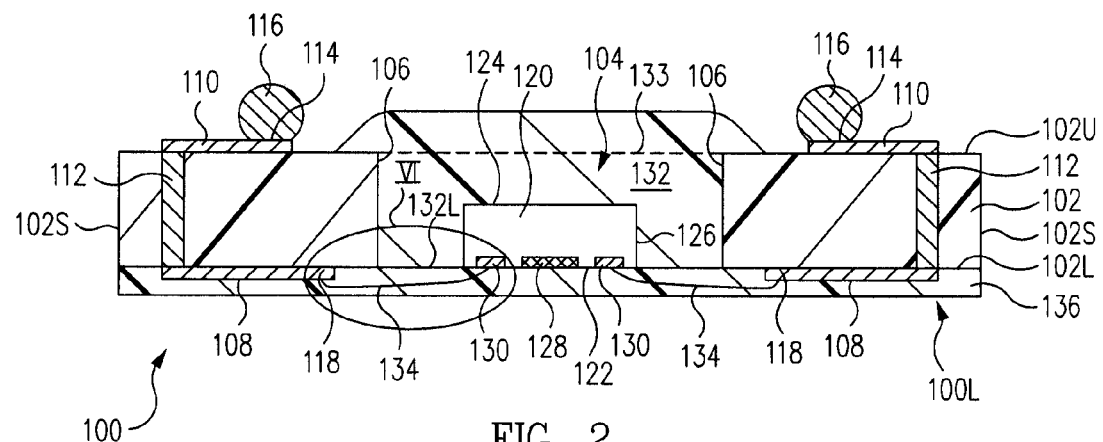
FIGS. 2, 3, 4 are cross-sectional views of the full cavity fingerprint sensor package of FIG. 1 along lines II-II, III-III, IV-IV, respectively, in accordance with various embodiments.
Figure 3:
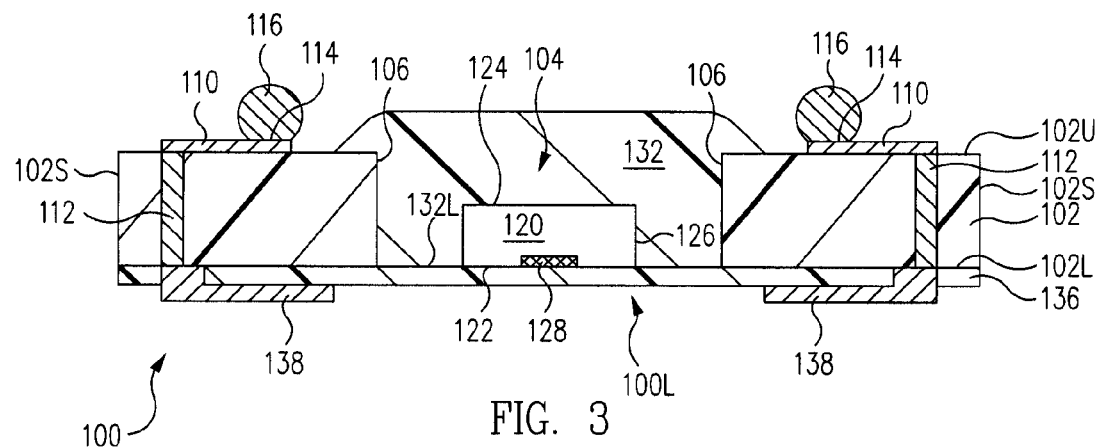
Figure 4:
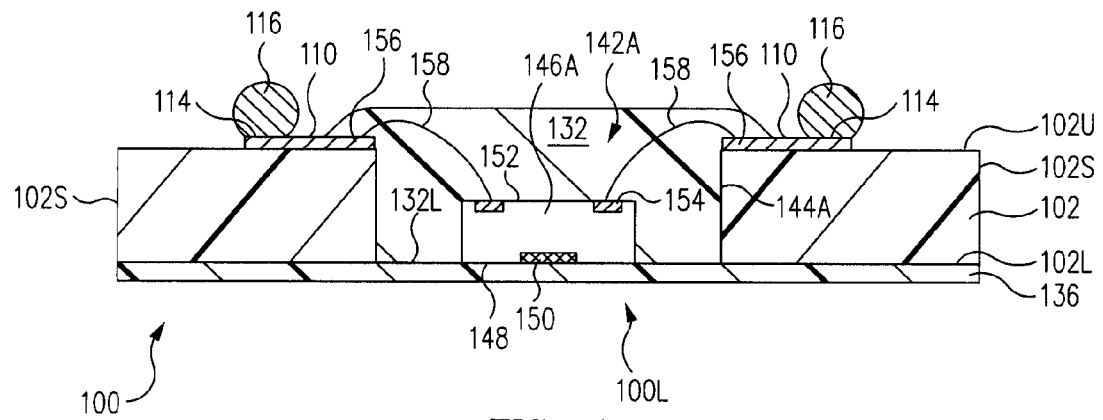

Now in more detail, FIG. 1 is a bottom plan view of a full cavity fingerprint sensor package 100 in accordance with one embodiment. FIGS. 2, 3, 4 are cross-sectional views of full cavity fingerprint sensor package 100 of FIG. 1 along lines II-II, III-III, IV-IV, respectively, in accordance with various embodiments. FIG. 5 is a top plan view of full cavity fingerprint sensor package 100 of FIG. 1 in accordance with one embodiment. Although FIGS. 1, 5 are referred to as bottom and top plan views, respectively, full cavity fingerprint sensor package 100 can be used in any orientation without respect to gravity. Accordingly, FIGS. 1 and 5 are sometimes called the finger side plan view and the interconnect side plan view, respectively.

Full cavity fingerprint sensor package 100, sometimes called an electronic component package, includes a substrate 102 having a lower, e.g., first, surface 102L and an upper, e.g., second surface 102U. Substrate 102 further includes a fingerprint sensor cavity 104 formed therein. Fingerprint sensor cavity 104, sometimes called a hole or aperture, extends entirely through substrate 102 and between upper surface 102U and lower surface 102L.

Fingerprint sensor cavity 104 is defined by a fingerprint sensor cavity sidewall 106. Fingerprint sensor cavity sidewall 106 extends perpendicularly between upper surface 102U and lower surface 102L. Although the terms parallel, perpendicular, coplanar and similar terms are used herein, it is to be understood that the described features may not be exactly parallel, perpendicular, and coplanar, but only substantially parallel, perpendicular, and coplanar to within excepted manufacturing tolerances.

Substrate 102 further includes outer sides 102S extends perpendicularly between upper surface 102U and lower surface 102L. Substrate 102 includes a dielectric material such as laminate, ceramic, printed circuit board material, or other dielectric material. In one particular embodiment, substrate 102 is a cavity laminate substrate.

Substrate 102 further includes lower, e.g., first, traces 108 formed at lower surface 102L and upper, e.g., second, traces 110 formed at upper surface 102U. Lower traces 108 are electrically connected to upper traces 110 by electrically conductive vias 112 extending through substrate 102 between upper surface 102U and lower surface 102L.

Upper traces 110 include terminals 114 upon which interconnection balls 116, e.g., solder balls, are formed. Although not illustrated in the figures, substrate 102 can further include an upper solder mask on upper surface 102U that protects upper traces 110 while exposing terminals 114. In one embodiment, interconnection balls 116 are distributed in an array thus forming a Ball Grid Array (BGA).

Lower traces 108 also include terminals 118, sometimes called bond fingers. Although not illustrated in the figures, substrate 102 can further include a lower solder mask on lower surface 102L that protects lower traces 108 while exposing terminals 118.

Although a particular electrically conductive pathway is described above, other electrically conductive pathways can be formed. For example, contact metallizations can be formed between the various electrical conductors.

Further, instead of straight though vias 112, in one embodiment, substrate 102 is a multilayer substrate and a plurality of vias and/or internal traces form the electrical interconnection between upper traces 110 and lower traces 108. Further, instead of a BGA, full cavity fingerprint sensor package 100 can be formed as a Land Grid Array (LGA) or other style package.

Paying particular attention now to FIGS. 1 and 2 together, full cavity fingerprint sensor 100 further includes a silicon die fingerprint sensor 120. Silicon die fingerprint sensors are well known to those of skill in the art, accordingly, only a brief description of silicon die fingerprint sensor 120 is provided below.

Silicon die fingerprint sensor 120 includes an active surface 122, an opposite inactive surface 124, and sides 126 extending perpendicularly between active surface 122 and inactive surface 124.

Silicon die fingerprint sensor 120 further includes a sensing element 128 and bond pads 130 on active surface 122. Sensing element 128, e.g., fine pitch metal patterns, senses fingerprints placed upon (or near) silicon die fingerprint sensor 120. Bond pads 130 are electrically connected to the internal circuitry of silicon die fingerprint sensor 120.

Silicon die fingerprint sensor 120 is mounted within fingerprint sensor cavity 104 of substrate 102. More particularly, active surface 122 is parallel to and coplanar with lower surface 102L of substrate 102.

In one embodiment, a removable tape is applied to lower surface 102L of substrate 102 and seals fingerprint sensor cavity 104 at lower surface 102L. Silicon die fingerprint sensor 120 is placed, active surface 122 down, upon the removable tape.

A package body 132, e.g., mold compound, epoxy or other reliable material, is formed around silicon die fingerprint sensor 120 and fills fingerprint sensor cavity 104. More particularly, package body 132 encapsulates, sometimes called encloses, covers or encases, inactive surface 124 and sides 126 of silicon die fingerprint sensor 120.

Further, package body 132 encapsulates fingerprint sensor cavity sidewall 106 and a portion of upper surface 102U of substrate 102 adjacent fingerprint sensor cavity 104. In another embodiment, package body 132 fills, partially or completely, fingerprint sensor cavity 104 but does not extend upon upper surface 102U of substrate 102.

For example, package body 132 is flush with upper surface 102U of substrate 102 as indicated by the dashed line 133 in FIG. 2 which supports formation of a LGA on upper surface 102U. For example, terminals 114 form lands for the LGA although terminals 114 are coupled to other electrically conductive structures which form lands for the LGA in other examples.

In either example, package body 132 is not illustrated in FIG. 5 to allow visualization of features within package body 132.

After formation of package body 132, silicon die fingerprint sensor 120 is secured and mounted within fingerprint sensor cavity 104 by package body 132. Accordingly, the removable tape is removed thus exposing active surface 122 including sensing element 128 and bond pads 130. Thus, active surface 122, lower surface 102L of substrate 102, and a lower, e.g., first, surface 132L of package body 132 are parallel to and coplanar with one another.

Bond pads 130 are electrically connected to terminals 118 of lower traces 108 by bond wires 134. In one embodiment, bond wires 134 are low loop thin wire bonds to minimize the loop height of bond wires 134, e.g., are zero loop height.

A protective coating 136 is applied to cover the lower surface 100L of full cavity fingerprint sensor 100. More particularly, protective coating 136, e.g., a dielectric protective epoxy or nonconductive ink, is applied to cover active surface 122 including sensing element 128 and bond pads 130 of silicon die fingerprint sensor 120. Further, protective coating 136 is applied to lower surface 132L of package body 132. Further, protective coating 136 is applied to cover lower surface 102L of substrate 102 including lower traces 118. In addition, protective coating 136 is applied to cover bond wires 134.

Protective coating 136 protects active surface 122, sensing element 128, bond pads 130, lower surface 132L of package body 132, lower surface 102L of substrate 102, lower traces 118, and bond wires 134 from the ambient environment. Accordingly, full cavity fingerprint sensor package 100 is robust, i.e., resistant to external damage.

In one embodiment, protective coating 136 is colored to have a desired color. Protective coating 136 is not illustrated in FIG. 1 to allow visualizations of features below protective coating 136.

Paying particular attention now to FIGS. 1 and 3 together, full cavity fingerprint sensor package 100 further includes an electrically conductive bezel 138. In accordance with the illustrated embodiment, bezel 138 is formed on protective coating 136 adjacent silicon die fingerprint sensor 120. In another embodiment, bezel 138 is formed on lower surface 102L of substrate 102 and protective coating 136 is patterned around bezel 138 to expose bezel 138.

In one embodiment, bezel 138 includes a metal plane and can further include an electrically conductive ink. In another embodiment, bezel 138 is formed of electrically conductive ink, e.g., applied directly over blind ground vias, and does not include a metal plane. In either case, bezel 138 can be colored as desired by selecting an appropriately colored conductive ink.

Bezel 138 is electrically connected to vias 112. During use, the respective interconnection balls 116 are electrically connected to a reference voltage source, e.g., ground. Accordingly, bezel 138 is electrically connected to the reference voltage source, e.g., ground. Thus, bezel 138 discharges electrostatic discharge (ESD) from a finger contacting full cavity fingerprint sensor package 100.

Paying particular attention now to FIGS. 1, 4 and 5 together, substrate 102 further includes light emitting diode (LED) cavities 142A, 142B. LED cavities 142A, 142B, sometimes called holes or apertures, extend entirely through substrate 102 and between upper surface 102U and lower surface 102L. Although separate fingerprint sensor cavity 104 and LED cavities 142A, 142E are set forth, in another embodiment, fingerprint sensor cavity 104 and LED cavities 142A, 142B are integrated into a single cavity.

LED cavities 142A, 142B are defined by LED cavity sidewalls 144A, 144B, respectively. LED cavity sidewalls 144A, 144B extend perpendicularly between upper surface 102U and lower surface 102L.

Full cavity fingerprint sensor package 100 includes a first light emitting diode 146A and a second light emitting diode 146A mounted within LED cavities 142A, 142B, respectively.

Paying particular attention to first light emitting diode 146A, light emitting diode 146A includes a light emitting face 148 including a light emitting area 150. Light emitting diode 146A further includes an inactive surface 152 having bond pads 154 formed thereon.

Bond pads 154 are electrically connected to upper traces 110, e.g., bond fingers 156 thereof, by electrically conductive bond wires 158. During use, light emitting area 150 emits light based on signals on bond pads 154 as those of skill in the art will understand in light of this disclosure. For example, light is emitted to provide a visual feedback to the user that the user's fingerprint has been successfully sensed.

Light emitting diode 146B is similar or identical to light emitting diode 146A and thus the discussion of light emitting diode 146A including mounting and electrical interconnection therewith is equally applicable to light emitting diode 146B and so is not repeated.

In one embodiment, a removable tape, e.g., the same removable tape used to mount silicon die fingerprint sensor 120 as discussed above, is applied to lower surface 102L of substrate 102. The removal tape seals LED cavities 142A, 142B at lower surface 102L. Light emitting diodes 146A, 146B are placed, light emitting faces 148 down, upon the removable tape.

Package body 132, e.g., the same mold compound used to encapsulate silicon die fingerprint sensor 120, is formed around light emitting diodes 146A, 146B and fills LED cavities 142A, 142B, respectively.

Package body 132 encapsulates, sometimes called encloses, covers, or encases, inactive surfaces 152 and sides of light emitting diodes 146A, 146B. Further, package body 132 encapsulates LED cavity sidewalls 144A, 144B and, optionally, portions of upper surface 102U of substrate 102 adjacent LED cavities 142A, 142B. In accordance with this embodiment, package body 132 further encapsulates bond wires 158 and bond fingers 156 of upper traces 110.

After formation of package body 132, light emitting diodes 146A, 146B are secured within LED cavities 142A, 142B by package body 132. Accordingly, the removable tape is removed thus exposing light emitting faces 148 including light emitting areas 150. Thus, light emitting faces 148, lower surface 102L of substrate 102, and lower surface 132L of package body 132 are parallel to and coplanar with one another.

Protective coating 136 is applied to cover and protect light emitting faces 148 including light emitting areas 150 of light emitting diodes 146A, 146B.

In accordance with yet another embodiment, bond pads 154 are formed on light emitting faces 148 of light emitting diodes 146A, 146B instead of on inactive surfaces 152 as illustrated. In accordance with this embodiment, bond pads 154 on light emitting faces 148 are electrically connected to terminals 118 of lower traces 108 by bond wires 134 in a manner similar to that illustrated in FIG. 2 and discussed above.

In accordance with one embodiment, referring now to FIGS. 1, 2, 3, 4 and 5 together, a method of fabricating full cavity fingerprint sensor package 100 includes providing substrate 102 having fingerprint sensor cavity 104 and LED cavities 142A, 142B formed therein. A removable tape is applied to lower surface 102L of substrate 102 and seals fingerprint sensor cavity 104 and LED cavities 142A, 142B.

Silicon die fingerprint sensor 120 and light emitting diodes 146A, 146B are mounted to the removable tape and within fingerprint sensor cavity 104 and LED cavities 142A, 142B, respectively. Bond pads 154 of light emitting diodes 146A, 146B are electrically connected to bond fingers 156 of upper traces 110 with bond wires 158. Silicon die fingerprint sensor 120 and light emitting diodes 146A, 146B are encapsulated within package body 132. The removable tape is removed. Bond pads 130 of silicon die fingerprint sensor 120 are electrically connected to terminals 118 of lower traces 108 by bond wires 134. Protective coating 136 and bezel 138 are formed.

In one embodiment, full cavity fingerprint sensor package 100 is formed simultaneously with a plurality of full cavity fingerprint sensor packages 100 in an array or strip as described above. The array or strip is cut to singulate the full cavity fingerprint sensor package 100 from one another. By forming full cavity fingerprint sensor package 100 in an array or strip, a high volume low cost assembly technique is achieved.

Full cavity fingerprint sensor package 100 provides a flat lower surface 100L. As set forth above, both protective coating 136 and bezel 138 can be colored to have desired colors. Accordingly, lower surface 100L can be colored as desired enhancing the attractiveness for consumer applications. Further, light emitting diodes 146A, 146B and bezel 138 are integrated into full cavity fingerprint sensor package 100. Further, full cavity fingerprint sensor package 100 is formed using a high volume low cost assembly technique in one embodiment.

Figure 6:
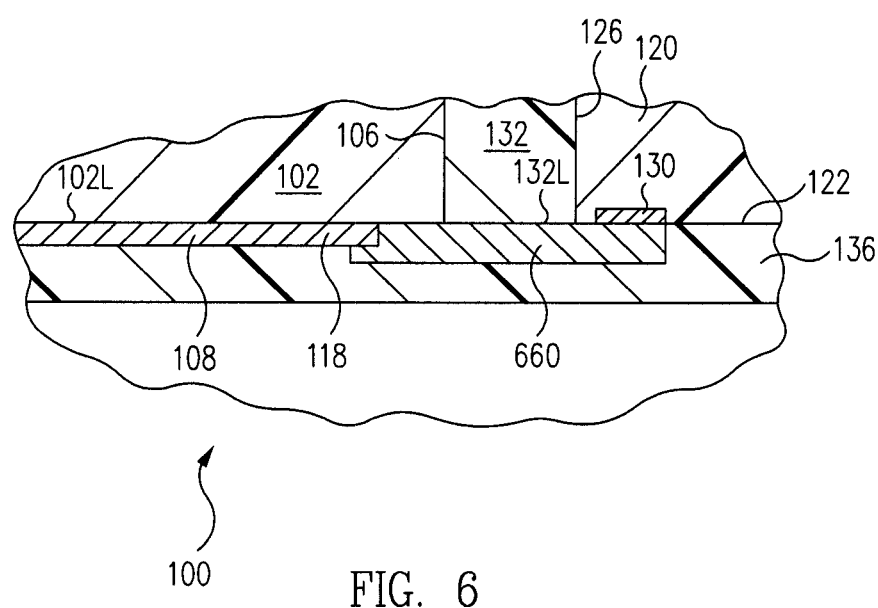
FIG. 6 is an enlarged cross-sectional view of the region VI of the full cavity fingerprint sensor package of FIG. 2 in accordance with another embodiment.

FIG. 6 is an enlarged cross-sectional view of the region VI of full cavity fingerprint sensor package 100 of FIG. 2 in accordance with another embodiment. In accordance with this embodiment, instead of using bond wires, bond pads 130 are electrically connected to terminals 118 of lower traces 108 by electrically conductive polymer thick film (PTF) conductors 660. Illustratively, PTF conductors 660 are formed by screen printing electrically conductive polymer thick film. Although not illustrated in FIG. 6, in one embodiment, one or more dielectric layers are applied prior to formation of PTF conductors 660 and patterned to expose bond pads 130 and terminals 118. Further, protective coating 136 covers and protects PTF conductors 660.

Figure 7:
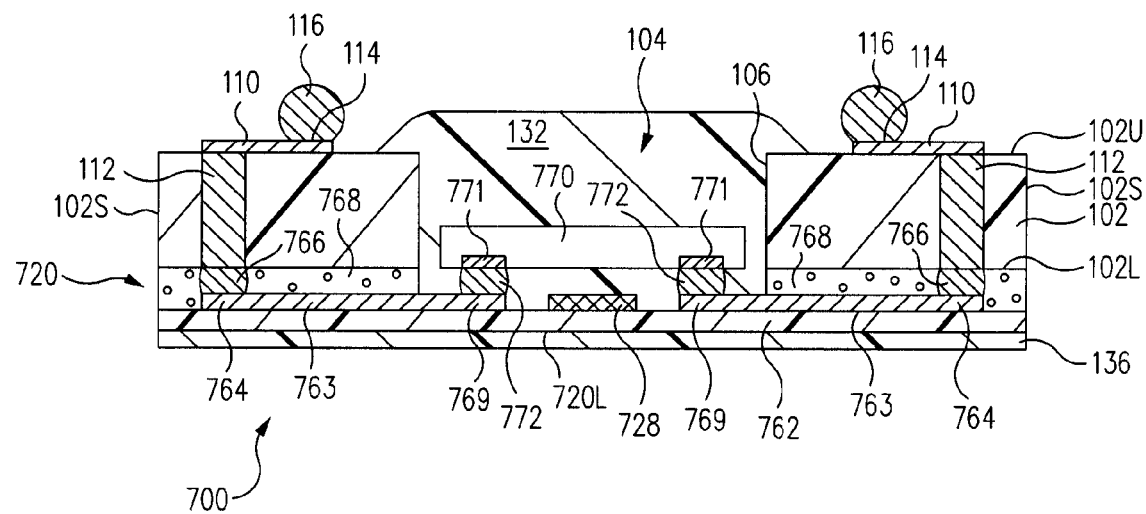
FIG. 7 is a cross-sectional view of a full cavity fingerprint sensor package in accordance with another embodiment.

FIG. 7 is a cross-sectional view of a full cavity fingerprint sensor package 700 in accordance with another embodiment. Full cavity fingerprint sensor package 700 of FIG. 7 is similar to full cavity fingerprint sensor package 100 of FIGS. 1-5 with one notable exception being that full cavity fingerprint sensor package 700 is formed with a sensing element on flex fingerprint sensor 720.

More particularly, full cavity fingerprint sensor package 700 includes substrate 102, lower surface 102L, upper surface 102U, sides 102S, fingerprint sensor cavity 104, fingerprint sensor cavity sidewall 106, upper traces 110, vias 112, terminals 114, interconnection balls 116, package body 132, and protective coating 136 similar or identical to substrate 102, lower surface 102L, upper surface 102U, sides 102S, fingerprint sensor cavity 104, fingerprint sensor cavity sidewall 106, upper traces 110, vias 112, terminals 114, interconnection balls 116, package body 132, and protective coating 136 of full cavity fingerprint sensor package 100 of FIG. 1, respectively, and so the description thereof is not repeated here.

Referring now to FIG. 7, sensing element on flex fingerprint sensor 720 includes a flexible substrate 762, a sensing element 728 and traces 763. Flexible substrate 762 is a flexible dielectric substrate. Sensing element 728, e.g., fine pitch metal patterns, is formed on flexible substrate 762. Sensing element 728 senses fingerprints placed upon flexible substrate 762 directly opposite sensing element 728.

Traces 763 are formed on flexible substrate 762. Traces 763 include substrate terminals 764. Substrate terminals 764 are electrically connected to vias 112 at lower surface 102L of substrate 102 with electrically conductive substrate bumps 766. In one embodiment, an adhesive 768 fills the region between lower surface 102L of substrate 102 and sensing element on flex finger sensor 720.

Traces 763 further include electronic component terminals 769. An electronic component 770 is flip chip mounted, i.e., bond pads 771 thereof, to electronic component terminals 769 with flip chip bumps 772. Electronic component 770 is an application specific integrated circuit (ASIC) that controls the operation of sensing element 728 as those of skill in the art will understand in light of this disclosure. Protective coating 136 covers the lower exposed surface 720L of sensing element on flex finger sensor 720. Although electronic component 770 is illustrated and described as being mounted in a flip chip configuration, in another embodiment, electronic component 770 is mounted in a wirebond configuration wherein bond pads 771 are electrically connected to electronic component terminals 769 with bond wires.

A package body 132, e.g., mold compound, is formed around electronic component 770 and the exposed portion of sensing element on flex fingerprint sensor 720. More particularly, package body 132 fills fingerprint sensor cavity 104.

Figure 8:
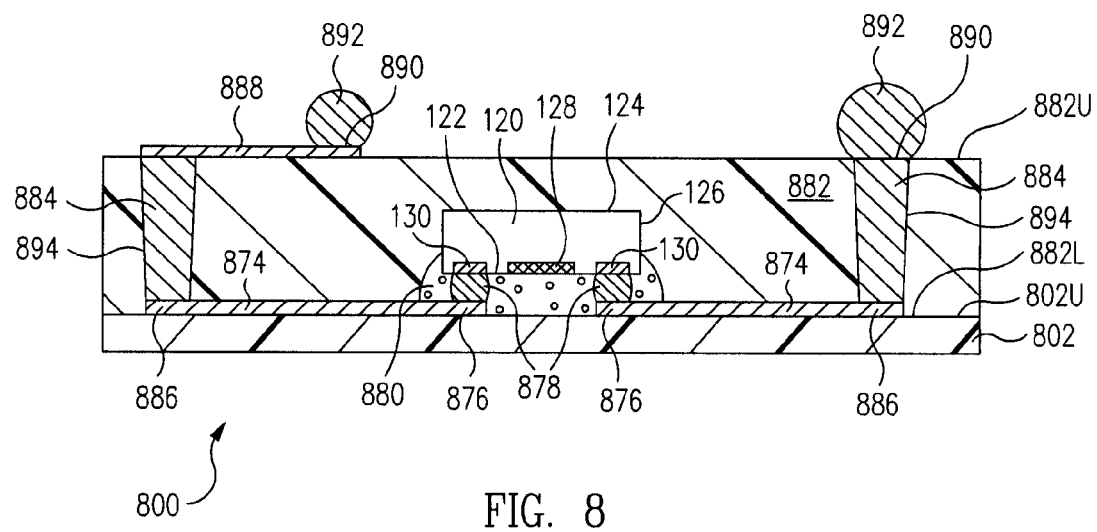
FIG. 8 is a cross-sectional view of a thin substrate fingerprint sensor package in accordance with another embodiment.

FIG. 8 is a cross-sectional view of a thin substrate fingerprint sensor package 800 in accordance with another embodiment. In accordance with this embodiment, thin substrate fingerprint sensor package 800 includes a dielectric thin substrate 802. Formed on an upper, e.g., first, surface 802U of thin substrate 802 are electrically conductive traces 874.

Bond pads 130 of silicon die fingerprint sensor 120 are physically and electrically connected to electronic component terminals 876 of traces 874 by electrically conductive flip chip bumps 878, i.e., silicon die fingerprint sensor 120 is flip chip mounted to traces 874. Flip chip bumps 878 are low standoff bumps in one embodiment to minimize the distance between a finger and sensing element 128. Optionally, an underfill 880 is applied between active surface 122 of silicon die fingerprint sensor 120 and upper surface 802U of thin substrate 802 and to enclose flip chip bumps 878.

To reduce the distance between a finger touching thin substrate 802 and sensing element 128, in one embodiment, thin substrate 802 is thinned.

A package body 882, e.g., molding compound, encloses inactive surface 124 and sides 126 of silicon die fingerprint sensor 120, underfill 880, upper surface 802U of thin substrate 802, and any expose portions of traces 874.

Package body 882 includes an upper, e.g., first, surface 882U and opposite lower, e.g., second, surface 882L. Electrically conductive vias 884, sometimes called through mold vias (TMV), extend through package body 882 from upper surface 882U to lower surface 882L. Vias 884 are electrically connected to substrate terminals 886 of traces 874.

As illustrated at the left side of thin substrate fingerprint sensor package 800 of FIG. 8, optionally, upper traces 888 are electrically connected to vias 884. Upper traces 888 are formed on upper surface 882U of package body 884, although are embedded within upper surface 882U in other embodiments. Upper traces 888 include terminals 890. Interconnection balls 892 are formed on terminals 890.

In yet another embodiment, as illustrated at the right side of thin substrate fingerprint sensor package 800 of FIG. 8, the upper surfaces of vias 884 form terminals 890.

In one embodiment, to form fingerprint sensor package 800, silicon die fingerprint sensor 120 is flip chip mounted to terminals 876 by flip chip bumps 878. Underfill 880 is applied between active surface 122 of silicon die fingerprint sensor 120 and upper surface 802U of thin substrate 802.

The assembly is over molded to form package body 882. Via apertures 894 are formed through package body 882, e.g., using laser ablation, to expose substrate terminals 886 of traces 874. Via apertures 894 are filled, fully or partially, with electrically conductive material, e.g., copper, to form vias 884. Optionally, upper traces 888 are formed and interconnection balls 892 are formed on terminals 890.

Referring now to FIGS. 7 and 8 together, in another embodiment, thin substrate fingerprint sensor package 800 is formed with sensing element on flex fingerprint sensor 720 instead of silicon die fingerprint sensor 120. In accordance with this embodiment, sensing element on flex fingerprint sensor 720 is mounted to thin substrate 802. The assembly is over molded to form package body 882. Via apertures 894 are formed through package body 882, e.g., using laser ablation, to expose substrate terminals 764 of traces 763. Via apertures 894 are filled, fully or partially, with electrically conductive material, e.g., copper, to form vias 884. Optionally, upper traces 888 are formed and interconnection balls 892 are formed on terminals 890.

Figure 9:
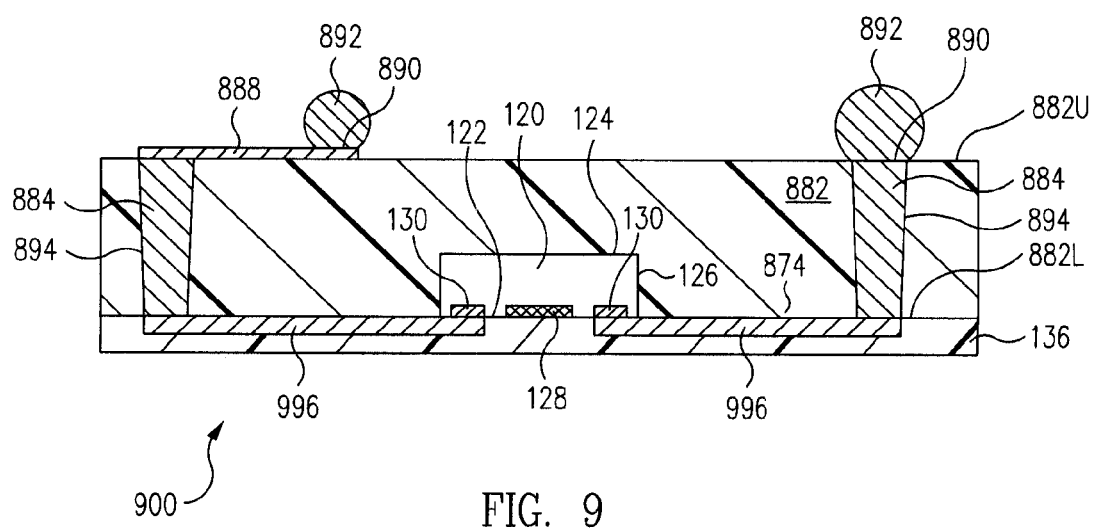
FIG. 9 is a cross-sectional view of a fingerprint sensor package in accordance with another embodiment.

FIG. 9 is a cross-sectional view of a fingerprint sensor package 900 in accordance with another embodiment. Fingerprint sensor package 900 of FIG. 9 is similar to fingerprint sensor package 800 of FIG. 8 and only the significant differences are discussed below.

Referring now to FIG. 9, in accordance with this embodiment, bond pads 130 of silicon die fingerprint sensor 120 are electrically connected to vias 884 by traces 996, sometimes called redistribution layer (RDL) traces. Traces 996 are formed on lower surface 882L of package body 882 although in one embodiment a dielectric layer is applied between lower surface 882L and traces 996. Traces 996, lower surface 882L of package body 882 and active surface 122 of silicon die fingerprint sensor 120 are enclosed in protective coating 136.

In one embodiment, to form fingerprint sensor package 900, silicon die fingerprint sensor 120 is mounted, active surface 122 down, on a removable carrier. Silicon die fingerprint sensor 120 is encapsulated within package body 882, sometimes called over molded. The removable carrier is removed thus exposing active surface 122 of silicon die fingerprint sensor 120 and lower surface 882L of package body 882. Traces 996 are formed, e.g., by selectively applying a conductive material such as copper. Protective coating 136 is then applied to cover traces 996, lower surface 882L of package body 882 and active surface 122 of silicon die fingerprint sensor 120.

Via apertures 894 are formed through package body 882, e.g., using laser ablation, to expose traces 996. Via apertures 894 are filled with electrically conductive material, e.g., copper, to form vias 884. Optionally, upper traces 888 are formed and interconnection balls 892 are formed on terminals 890.

Although a particular order of operations is provided, the operations are performed in a different order in another embodiment. For example, vias 884 can be formed prior to formation of traces 996.

Further, in another embodiment, fingerprint sensor package 900 is formed with electronic component 770 (see FIG. 7), sometimes called an ASIC, instead of silicon die fingerprint sensor 120. In accordance with this embodiment, RDL traces 996 form the sensing element, i.e., perform the function of sensing element 128. Thus, RDL traces 996 form both the sensing element and the interconnect in accordance with this embodiment.

Figure 10:
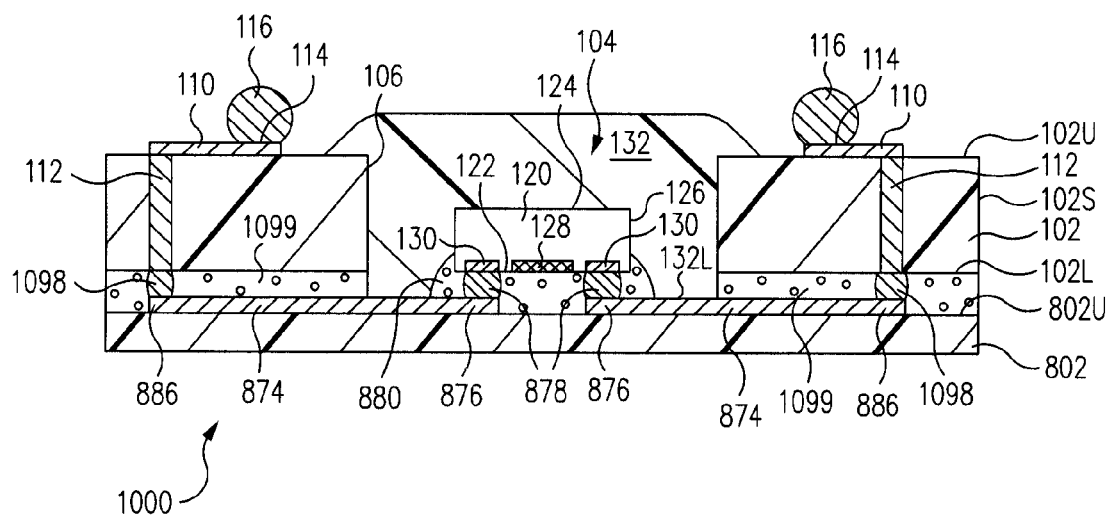
FIG. 10 is a cross-sectional view of a hybrid fingerprint sensor package in accordance with another embodiment.

FIG. 10 is a cross-sectional view of a hybrid fingerprint sensor package 1000 in accordance with another embodiment. Hybrid fingerprint sensor package 1000 of FIG. 10 is similar to fingerprint sensor packages 100, 800 of FIGS. 2, 8, respectively, and only the significant differences are discussed below.

In accordance with this embodiment, bond pads 130 of silicon die fingerprint sensor 120 are physically and electrically connected to electronic component terminals 876 of traces 874 by flip chip bumps 878. Optionally, underfill 880 is applied between active surface 122 of silicon die fingerprint sensor 120 and upper surface 802U of thin substrate 802 and to enclose flip chip bumps 878.

Substrate 102, sometimes called a second substrate, is mounted to thin substrate 802, sometimes called a primary substrate. More particularly, substrate terminals 886 of traces 874 are electrically connected to vias 112 at lower surface 102L of substrate 102 with conductive substrate bumps 1098. In one embodiment, an adhesive 1099 fills the region between lower surface 102L of substrate 102 and upper surface 802U of thin substrate 802.

Package body 132 is formed around silicon die fingerprint sensor 120 and fills fingerprint sensor cavity 104 and thus covers the portion of upper surface 802U of thin substrate 802 exposed through fingerprint sensor cavity 104.

Figure 11:
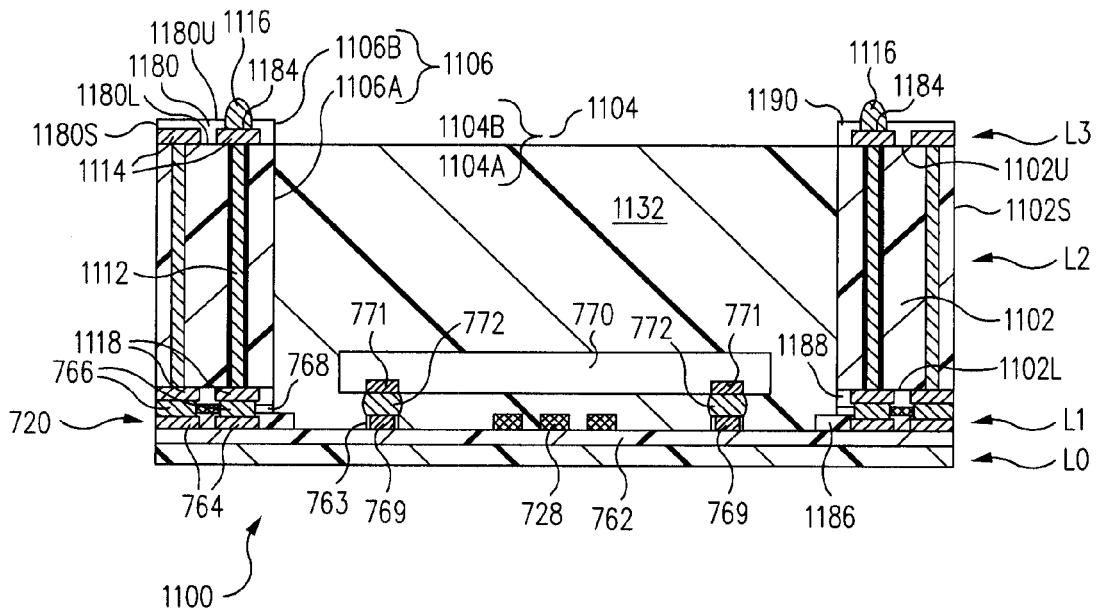
FIG. 11 is a cross-sectional view of a fingerprint sensor package in accordance with another embodiment.

FIG. 11 is a cross-sectional view of a fingerprint sensor package 1100 in accordance with another embodiment. Fingerprint sensor package 1100 of FIG. 11 is similar to fingerprint sensor package 700 of FIG. 7 and only the significant differences are discussed below.

Referring now to FIG. 11, in accordance with this embodiment, fingerprint sensor package 1100 includes four primary layers, a layer L0 (layer 0), a layer L1 (layer 1), a layer L2 (layer 2), and layer L3 (layer 3). Layer L0 is sometimes called a blank. Layer L0 is a dielectric layer.

Layer L1 is mounted on layer L2, e.g., with adhesive. In one embodiment, layer L1 is sensing element on flex fingerprint sensor 720. As discussed above, sensing element on flex fingerprint sensor 720 includes flexible substrate 762, sensing element 728 and traces 763. Flexible substrate 762 is a flexible dielectric substrate that is mounted to layer L0. Sensing element 728 is formed on flexible substrate 762. Sensing element 728 senses fingerprints placed upon layer L0 directly opposite sensing element 728.

Traces 763 are formed on flexible substrate 762. Traces 763 include substrate terminals 764 and electronic component terminals 769, e.g., thick tin plated bump pads. Electronic component 770 is flip chip mounted, i.e., bond pads 771 thereof, to electronic component terminals 769 with flip chip bumps 772. Electronic component 770 is an application specific integrated circuit (ASIC) that controls the operation of sensing element 728 as those of skill in the art will understand in light of this disclosure.

Layer L2 includes a substrate 1102 having a lower, e.g., first, surface 1102L and an upper, e.g., second, surface 1102U. Substrate 1102 further includes a fingerprint sensor cavity 1104A formed therein. Fingerprint sensor cavity 1104A, sometimes called a hole or aperture, extends entirely through substrate 1102 and between upper surface 1102U and lower surface 1102L.

Fingerprint sensor cavity 1104A is defined by a fingerprint sensor cavity sidewall 1106A. Fingerprint sensor cavity sidewall 1106A extends perpendicularly between upper surface 1102U and lower surface 1102L.

Substrate 1102 further includes outer sides 1102S extending perpendicularly between upper surface 1102U and lower surface 1102L. Substrate 1102 includes a dielectric material such as laminate, ceramic, printed circuit board material, or other dielectric material.

Substrate 1102 further includes lower terminals 1118 at lower surface 1102L and upper terminals 1114 at upper surface 1102U. Lower terminals 1118 are electrically connected to upper terminals 1114 by electrically conductive vias 1112 extending through substrate 1102 between upper surface 1102U and lower surface 1102L. Substrate 1102 can further include traces that re-route the pattern of lower terminals 1118 to the pattern of upper terminals 1114. Further, instead of straight though vias 1112, in one embodiment, substrate 1102 is a multilayer substrate and a plurality of vias and/or internal traces form the electrical interconnection between lower terminals 1118 and upper terminals 1114.

Lower terminals 1118 are electrically connected to substrate terminals 764 with conductive substrate bumps 766, e.g., copper paste. In one embodiment, an adhesive 768 fills the region between lower surface 1102L of substrate 1102 and sensing element on flex fingerprint sensor 720.

Layer L3 provides routing and the package ball grid array. Layer L3 includes a substrate 1180 having a lower, e.g., first, surface 1180L and an upper, e.g., second surface 1180U. Substrate 1180 further includes a fingerprint sensor cavity 1104B formed therein. Fingerprint sensor cavity 1104B, sometimes called a hole or aperture, extends entirely through substrate 1180 and between upper surface 1180U and lower surface 1180L.

Fingerprint sensor cavity 1104B is defined by a fingerprint sensor cavity sidewall 1106B. Fingerprint sensor cavity sidewall 1106B extends perpendicularly between upper surface 1180U and lower surface 1180L.

Fingerprint sensor cavities 1104A, 1104B of layers L2, L3 collectively form a fingerprint sensor cavity 1104. Further, fingerprint sensor cavity sidewalls 1106A, 1106B collectively form a fingerprint sensor cavity sidewall 1106.

Substrate 1180 further includes outer sides 1180S extending perpendicularly between upper surface 1180U and lower surface 1180L. Substrate 1180 includes a dielectric material such as laminate, ceramic, printed circuit board material, or other dielectric material.

Substrate 1180 further includes terminals 1184. Terminals 1184 are electrically connected to upper terminals 1114 of layer L2, e.g., by electrically conductive vias and/or traces of layer L3 and/or electrically conductive bumps. Interconnection balls 1116, e.g., solder balls, are formed on terminals 1184.

A package body 1132, e.g., mold compound, is formed around electronic component 770 and the exposed portion of sensing element on flex fingerprint sensor 720. More particularly, package body 1132 fills fingerprint sensor cavity 1104.

In accordance with one embodiment, layers L1, L2, L3 further includes solder resists 1186, 1188, 1190, sometimes called solder masks. Solder resist 1186, 1188, 1190 cover and protect electrically conductive structures, e.g., copper traces, of layers L1, L2 and L3 while exposing terminals.

In one embodiment, fingerprint sensor package 1100 is formed in a panel, e.g., a 74×240 mm panel, having 270 units per strip. Further, various layers L0, L1, L2, L3 can be pre-assembled. For example, layers L2, L3 can be pre-assembled.

Figure 12:
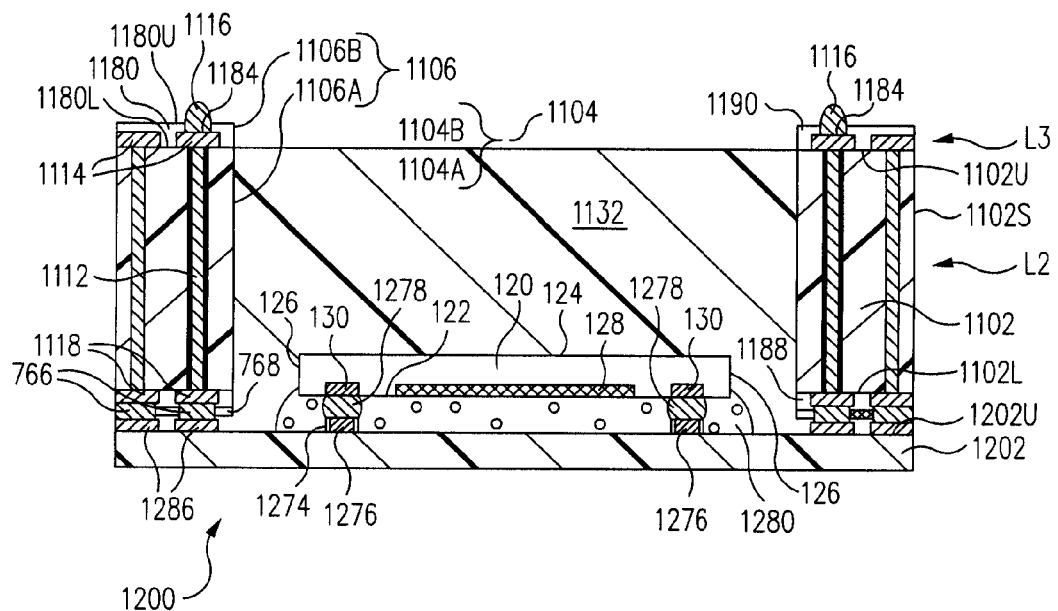
FIG. 12 is a cross-sectional view of a fingerprint sensor package in accordance with yet another embodiment.

FIG. 12 is a cross-sectional view of a fingerprint sensor package 1200 in accordance with yet another embodiment. Fingerprint sensor package 1200 of FIG. 12 is similar to fingerprint sensor package 1100 of FIG. 11 and only the significant differences are discussed below.

Referring now to FIG. 12, fingerprint sensor package 1200 includes a dielectric silicon interposer 1202. Formed on an upper, e.g., first, surface 1202U of silicon interposer 1202 are electrically conductive traces 1274.

Bond pads 130 of silicon die fingerprint sensor 120 are physically and electrically connected to electronic component terminals 1276, e.g., comprising a tin-silver (Sn—Ag) finish, of traces 1274 by electrically conductive flip chip bumps 1278, i.e., silicon die fingerprint sensor 120 is flip chip mounted to traces 1274. Optionally, an underfill 1280 is applied between active surface 122 of silicon die fingerprint sensor 120 and upper surface 1202U of silicon interposer 1202 and to enclose flip chip bumps 1278.

To reduce the distance between a finger touching silicon interposer 1202 and sensing element 128, in one embodiment, silicon interposer 1202 is thinned.

Lower terminals 1118 are electrically connected to substrate terminals 1286 of traces 1274 with conductive substrate bumps 766, e.g., copper paste. In one embodiment, an adhesive 768 fills the region between lower surface 1102L of substrate 1102 and upper surface 1202U of silicon interposer 1202.

Package body 1132 encloses inactive surface 124 and sides 126 of silicon die fingerprint sensor 120, underfill 1280, upper surface 1202U of silicon interposer 1202, and any expose portions of traces 1274.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. An electronic component package comprising:
a fingerprint sensor comprising an active surface comprising a sensing element for directly sensing fingerprints; and
a substrate comprising a fingerprint sensor cavity, a first surface and a second surface, the first surface and the second surface corresponding respectively to a lower limit and an upper limit of a volume of the fingerprint sensor cavity, wherein the fingerprint sensor including the sensing element is located within the volume of the fingerprint sensor cavity and the active surface of the fingerprint sensor is parallel to and coplanar with the first surface of the substrate, wherein the substrate further comprises traces on the first surface coupled to bond pads on the active surface of the fingerprint sensor.

2. The electronic component package of claim 1 further comprising bond wires coupling the bond pads to the traces.

3. The electronic component package of claim 1 further comprising polymer thick film (PTF) conductors coupling the bond pads to the traces.

4. The electronic component package of claim 1 further comprising a protective coating covering the active surface, the traces, and the first surface of the substrate.

5. The electronic component package of claim 1 further comprising terminals on a second surface of the substrate, the terminals being coupled to the traces.

6. The electronic component package of claim 1 wherein the electronic component package is selected from the group consisting of a Ball Grid Array (BGA) and a Land Grid Array (LGA).

7. The electronic component package of claim 1 further comprising a package body in the fingerprint sensor cavity.

8. The electronic component package of claim 7 wherein the package body mounts the fingerprint sensor in the fingerprint sensor cavity.

9. The electronic component package of claim 7 wherein the package body comprises a surface parallel to and coplanar with the active surface of the fingerprint sensor and the first surface of the substrate.

10. The electronic component package of claim 1 further comprising a bezel adjacent the fingerprint sensor.

11. The electronic component package of claim 10 wherein the bezel comprises a conductive ink coupled to the first surface of the substrate.

12. The electronic component package of claim 1 further comprising a diode having a light emitting face parallel to and coplanar with the first surface of the substrate.

13. An electronic component package comprising:
a primary substrate comprising a first surface comprising traces thereon;
a fingerprint sensor mounted to terminals of the traces;
a package body directly contacting and enclosing an inactive surface and sides of the fingerprint sensor; and
electrically conductive vias extending entirely through the package body between a first surface of the package body and a second surface of the package body, the vias being coupled to the traces.

14. The electronic component package of claim 13 further comprising a second substrate comprising a fingerprint sensor cavity in which the fingerprint sensor is located.

15. An electronic component package comprising:
a flexible substrate;
a fingerprint sensing element coupled to the flexible substrate;
traces coupled to the flexible substrate, the traces comprising electronic component terminals;
an electronic component coupled to the electronic component terminals;
a substrate comprising a fingerprint sensor cavity in which the electronic component is located; and
a package body in the fingerprint sensor cavity and directly contacting and enclosing the electronic component.

16. The electronic component package of claim 15 further comprising a sensing element on flex fingerprint sensor comprising the flexible substrate, the fingerprint sensing element, and the traces.

17. The electronic component package of claim 15 further comprising an adhesive between the flexible substrate and the substrate.

18. An electronic component package comprising:
an electronic component comprising an active surface comprising bond pads;
redistribution layer (RDL) traces coupled to the bond pads;
a package body directly contacting and encapsulating an inactive surface opposite the active surface and sides of the electronic component; and
electrically conductive vias in the package body, wherein the RDL traces form an interconnect between the bond pads and the vias and also form a fingerprint sensing element.

* * * * *

UNITED STATES PATENT AND TRADEMARK OFFICE
CERTIFICATE OF CORRECTION

| | |
|---|---|
| PATENT NO. | : 8,717,775 B1 |
| APPLICATION NO. | : 12/848833 |
| DATED | : May 6, 2014 |
| INVENTOR(S) | : Bolognia et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 435 days.

Signed and Sealed this
Eighteenth Day of August, 2015

Michelle K. Lee
*Director of the United States Patent and Trademark Office*